(12) United States Patent  
Vekstein

(10) Patent No.: US 8,315,485 B2
(45) Date of Patent: Nov. 20, 2012

(54) SYSTEM AND METHOD FOR OBTAINING TEXT

(75) Inventor: Uri Vekstein, Haifa (IL)

(73) Assignee: Camtek Ltd., Migdal Haemek (IL)

( * ) Notice: Subject to any disclaimer, the term of this patent is extended or adjusted under 35 U.S.C. 154(b) by 680 days.

(21) Appl. No.: 12/507,827

(22) Filed: Jul. 23, 2009

(65) Prior Publication Data

US 2010/0046838 A1  Feb. 25, 2010

Related U.S. Application Data

(60) Provisional application No. 61/083,218, filed on Jul. 24, 2008.

(51) Int. Cl.
*G06K 9/20* (2006.01)
(52) U.S. Cl. ...................................................... 382/321
(58) Field of Classification Search .................. 382/100, 382/141–148, 151, 153–154, 181, 218, 318, 382/321; 348/86–87, 92, 94–95, 129–130; 901/46–47; 356/237.2–237.5; 700/224–225
See application file for complete search history.

(56) References Cited

U.S. PATENT DOCUMENTS

| | | | | |
|---|---|---|---|---|
| 5,175,774 A | * | 12/1992 | Truax et al. | 382/145 |
| 5,777,743 A | * | 7/1998 | Bacchi et al. | 356/370 |
| 6,630,995 B1 | * | 10/2003 | Hunter | 356/237.5 |
| 6,680,162 B1 | * | 1/2004 | Sinha et al. | 430/311 |
| 6,961,639 B2 | * | 11/2005 | Gaudon et al. | 700/225 |

* cited by examiner

*Primary Examiner* — Jose Couso
(74) *Attorney, Agent, or Firm* — Reches Patents

(57) ABSTRACT

A system includes a first supporting element, a first supporting element rotation module, a controller and a first optical head. The controller is configured to control a rotation of the first supporting element by the first supporting element rotation module. The first supporting element is coupled to the first optical head. The first supporting element rotation module is configured to rotate the first supporting element until text that is imprinted on a first side of a semiconductor wafer is located within a field of view of the first optical head. Semiconductors wafers of different size have text located at different locations. A method for obtaining a text imprinted on a first side of a semiconductor wafer, the method includes: determining a location of the text based on a size of the semiconductor wafer; rotating a first supporting element that is coupled to a first optical head until the text is located within a field of view of the first optical head; obtaining an image of the text by the first optical head; and translating the image of the text into text.

21 Claims, 9 Drawing Sheets

SYSTEM AND METHOD FOR OBTAINING TEXT

RELATED APPLICATIONS

This application claims priority from U.S. provisional patent application Ser. No. 61/083,218 filing date Jul. 24, 2008, which is incorporated herein by reference.

BACKGROUND

Semiconductor wafers may include text that is imprinted near their edges. The text can include a semiconductor wafer identifier, a batch identifier and the like. This text may be read by an optical head that has text recognition capabilities. This optical head may have a relatively high resolution that facilitates optical character recognition (OCR). OCR may include translating an image of text into text.

The optical head is expected to be relatively compact and cheap. This goal can be achieved by simplifying the optical configuration of the optical head and limiting the field of view of the optical head.

Semiconductor wafers of different sizes include text that is positioned in different locations. The limited field of view of a stationary optical head is not large enough to encompass text of semiconductor wafer of different sizes.

Prior art inspection systems included fixed optical heads that having a single field of view and were tailored to read text imprinted on semiconductor wafers of a single size.

There is a growing need to provide a system and method for reading text imprinted on semiconductor wafers of different sizes.

SUMMARY

According to various embodiments of the invention a method or a system for obtaining a text imprinted on a first side of a semiconductor wafer is provided. The method or system may include: (i) determining a location of the text based on the to a size of the semiconductor wafer; (ii) rotating a first supporting element that is coupled to a first optical head until the text is located within a field of view of the first optical head; (iii) obtaining an image of the text by the first optical head; and (iv) translating the image of the text into text.

According to an embodiment of the invention the determining of the location can be replaced by a stage of receiving information indicative of a location of the text. There may be a one to one mapping between the location of the text and a size of the semiconductor wafer on which the text is imprinted.

According to an embodiment of the invention the method can also include receiving information indicative of a location of the text. There may be a one to one mapping between the location of the text and a size of the semiconductor wafer, wherein the location of the text is responsive to a size of the semiconductor wafer.

According to an embodiment of the invention the method may include translating the image of the text by the first optical head.

According to an embodiment of the invention the method may include placing the first optical head at a certain position by rotating the first supporting element; wherein the certain position is selected from multiple possible positions that correspond to semiconductor wafers of different sizes.

The fields of view of the first optical head that correspond to at least two possible positions may in some cases not overlap.

According to an embodiment of the invention the method may include obtaining an image of a second text that is imprinted on a second side of the semiconductor wafer by a second optical head; and translating the image of the second text into text.

According to an embodiment of the invention the method may include determining a location of the second text based on the size of the semiconductor wafer; rotating a second supporting element that is coupled to the second optical head until the second text is located within a field of view of the second optical head; obtaining an image of the second text by the second optical head; and translating the image of the second text into text.

According to an embodiment of the invention the method may include simultaneously rotating the first supporting element and the second supporting element.

According to an embodiment of the invention the method may include determining a location of the second text based on the size of the semiconductor wafer; rotating the first supporting element until the second text is located within a field of view of the second optical head, wherein the first rotating element is coupled to the second optical head; obtaining an image of the second text by the second optical head; and translating the image of the second text into text.

According to an embodiment of the invention system is provided. The system may include a first supporting element, a first supporting element rotation module, a controller and a first optical head. The controller may be configured to control a rotation of the first supporting element by the first supporting element rotation module. The first supporting element may be coupled to the first optical head. The first supporting element rotation module may be configured to rotate the first supporting element until text that is imprinted on a first side of a semiconductor wafer is located within a field of view of the first optical head, wherein there may be a one to one mapping between the location of the text and a size of the semiconductor wafer.

According to an embodiment of the invention the controller may be configured to receive information indicative of a size of the semiconductor wafer and determine a certain location of the optical head out of multiple locations associated with semiconductor wafers of different sizes, wherein when the first optical head is positioned at the certain location the text is located within a field of view of the first optical head.

The fields of view of the first optical head that correspond to at least two possible positions may not overlap.

According to an embodiment of the invention the first supporting element rotation module may be configured to rotate a pole of the first supporting element about its axis. The pole may be coupled to an arm that is coupled to the first optical head. The arm may extend from the pole in a radial manner.

According to an embodiment of the invention the system may include a second optical head that is configured to obtain an image of a second text that is imprinted on a second side of the semiconductor wafer; wherein the system is further configured to translate the image of the second text into text.

According to an embodiment of the invention the controller may be configured to control a rotation of a second supporting element by a second supporting element rotation module; wherein the second supporting element is coupled to the second optical head; wherein the second supporting element rotation module is configured to rotate the second supporting element until the second text is located within a field of view of the second optical head; wherein a location of the second text is responsive to a size of the semiconductor wafer.

According to an embodiment of the invention the first supporting element and the second supporting element are rotated in parallel to each other.

According to an embodiment of the invention the system may include a semiconductor wafer pre-aligner.

BRIEF DESCRIPTION OF THE DRAWINGS

Further details, aspects, and embodiments of the invention will be described, by way of example only, with reference to the drawings.

DETAILED DESCRIPTION OF THE DRAWINGS

In the following specification, the invention will be described with reference to specific examples of embodiments of the invention. It will, however, be evident that various modifications and changes may be made therein without departing from the broader spirit and scope of the invention as set forth in the appended claims.

Because the apparatus implementing the present invention is, for the most part, composed of electronic and mechanical components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

It has been shown that text imprinted on semiconductor wafers of different sizes can be read by two optical heads that are located at opposite sides of a semiconductor wafer (one below the semiconductor wafer and the other above the semiconductor wafer). Both optical heads can be moved simultaneously. One head can be fixed.

An optical head can be connected to a supporting element that includes a pole that can rotate about its axis. The radial movement of that pole can be controlled by a piston that its linear movement is translated to a rotational movement of the pole.

Figure 1:
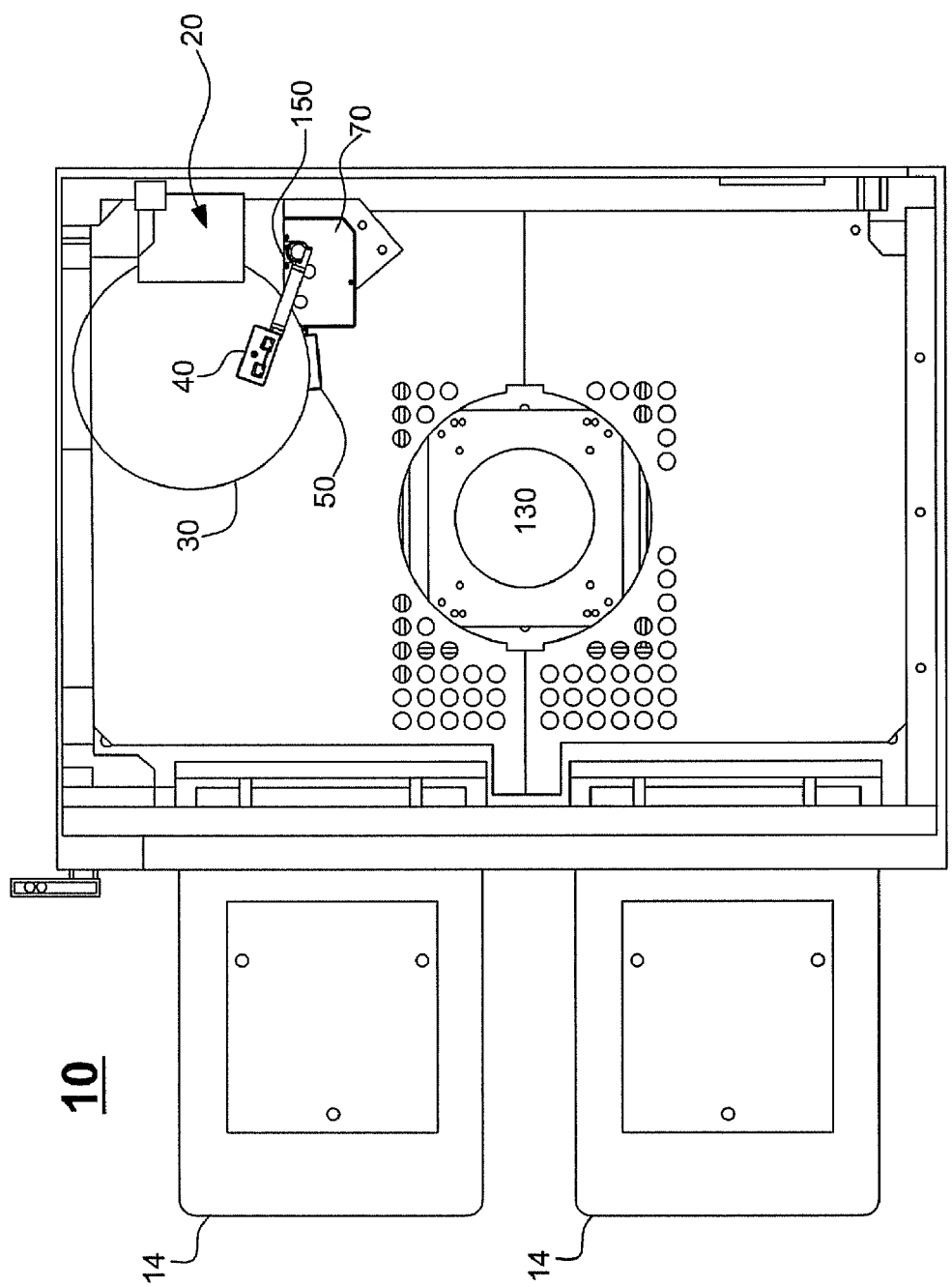
FIG. 1 illustrates a system that includes the optical head according top an embodiment of the invention.

FIG. 1 is a top view of system 10 that includes a first optical head 40 according to an embodiment of the invention. System 10 can be an automatic optical inspection system that can receive one or more semiconductor wafers and inspect these semiconductor wafers. System 10 includes a chamber 12 and two cassette holders 14 that may receive cassettes that store multiple semiconductor wafers. A robot of system 10 can transfer a semiconductor wafer 30 between a cassette, a pre-aligner 20 and a semiconductor wafer inspection module 130. Before semiconductor wafer 30 is inspected it is aligned by pre-aligner 20 and text that is imprinted on semiconductor wafer 30 is read and recognized. The text can for example be displayed to a user, compared to a database to determine which semiconductor wafer is being evaluated, for associating semiconductor wafer inspection results with the inspected wafer, and the like.

FIG. 1 illustrates a first optical head 40 that is located above semiconductor wafer 30 and also illustrates a portion of a second optical head 50 that is located below semiconductor wafer 30.

FIG. 1 illustrates optical head 40 as being positioned near pre-alignment unit 20, but this is not necessarily so. A pre-alignment process can initiate or even be completed before reading text that is imprinted on the semiconductor wafer. The pre-alignment process can include moving a semiconductor wafer to a desired position and to a desired orientation.

FIG. 1 also illustrates controller 150. Controller 150 can control a rotation of a first supporting element (denoted 64 in FIGS. 2, 3 and 5) by a first supporting element rotation module (denoted 111 in FIG. 7) that may include a piston (denoted 110 in FIG. 7) and linear to rotational movement converter (denoted 120 in FIG. 7). The controlling can include sending a command to rotate, indicating the desired rotation angle or otherwise participating in triggering the rotation of first supporting element 64. Controller 150 can send a command to piston 110 or to another component that controls the linear movement of piston 110—for example—by sending air pressure pulses to piston 110.

Controller 150 can receive information indicative of a location of the text. The information can indicate the location or indicate the size of the semiconductor wafer. A look up table or other data structure can be used to map semiconductor wafer size information to text location information. Controller 150 can determine a location of the text based on semiconductor wafer size information using such a data structure or a mathematical formula.

Controller 150 can be included within base [typo here, not sure what to do] a 70, can be proximate to first optical head 40, located near per-aligner 20, located within chamber 12 or outside chamber 12. Controller 150 can include one or more semiconductor cores, processors, control unit, internal memory, external memory or a combination thereof. The controller can store or can access a data structure that maps semiconductor wafer sizes to location of text imprinted on one or two sides of the semiconductor wafer.

FIGS. 2, 3, 4 and 5 illustrate portions of system 10 that include one or two optical heads and also illustrate two possible positions of a first optical head 40 that is positioned above semiconductor wafer 30. In addition, fields of view such as fields of view 41 and 42 are also shown. Field of view 41 is obtained when first optical head 40 is positioned at a first location and field of view 42 is obtained when first optical head 40 is at a second position.

Figure 2:
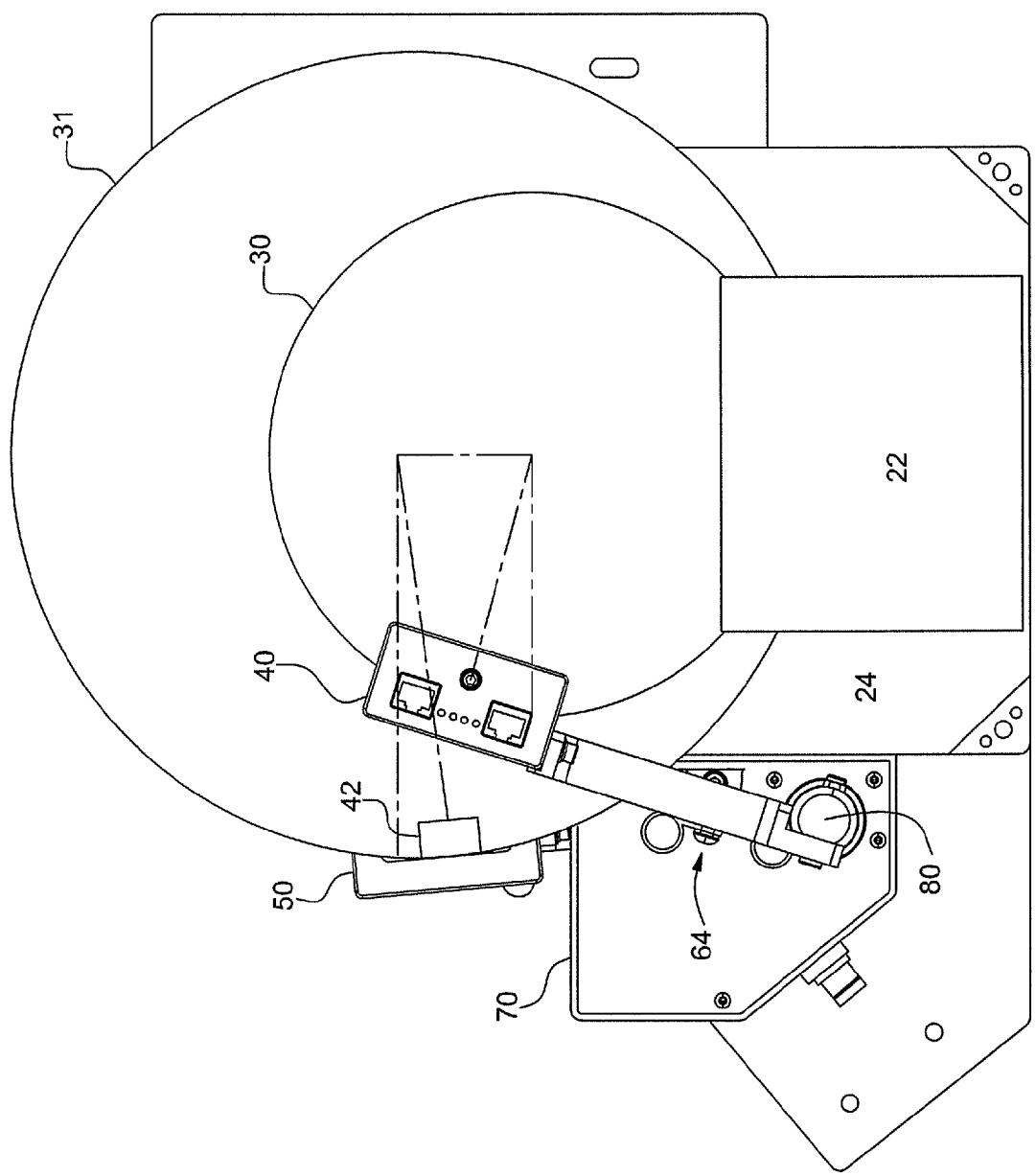
FIG. 2 illustrates a first location out of two possible location of a first optical head that correspond to two different semiconductor wafers of different sizes, according to an embodiment of the invention.

FIG. 2 illustrates semiconductor wafers 30 and 31 of different sizes. For example, semiconductor wafer 30 can be a 200 mm semiconductor wafer while semiconductor wafer 31 can be a 300 mm semiconductor wafer. Although FIG. 2 illustrates both semiconductor wafers those of skill in the art will appreciate that only one semiconductor wafer can be placed at pre-aligner 20 at a time.

Pre-aligner 20 includes pre-aligner optical head 22, a rotating stage 26 (illustrated in FIG. 4) and pre-aligner base 24. Semiconductor wafers such as semiconductor wafer 30 are placed on stage 26—below optical head 22. The pre-aligner optical head 22 images a portion of semiconductor wafer 30 and can rotate semiconductor wafer 30 or move it along either one of an imaginary X axis and Y axis in order to place semiconductor wafer 30 at a desired location and a desired orientation. Referring to FIG. 1, and assuming that a front side of system 10 interfaces with cassettes then the imaginary axis X can be parallel to that front side while the imaginary Y axis can be orthogonal to that front side.

Once semiconductor wafer 30 is placed at the desired location and at a desired location is it "aligned" and text that is imprinted on semiconductor wafer 30 can be read. It is noted a robot of system 10 can assist in the alignment process.

FIG. 2 illustrates first optical head 40 as being at a first position that allows first optical head 40 to read text imprinted on semiconductor wafer 30. FIG. 2 also illustrates field of view 42 of first optical head 40. When positioned at a second position (as illustrated in FIG. 3) first optical head 40 can read text imprinted on semiconductor wafer 31.

First optical head 40 is connected to arm 60. Arm 60 is connected to pole 80. Pole 80 rotates about its axis and causes first optical head 40 to move along a curved path. Pole 80 is connected to base 70.

Figure 3:
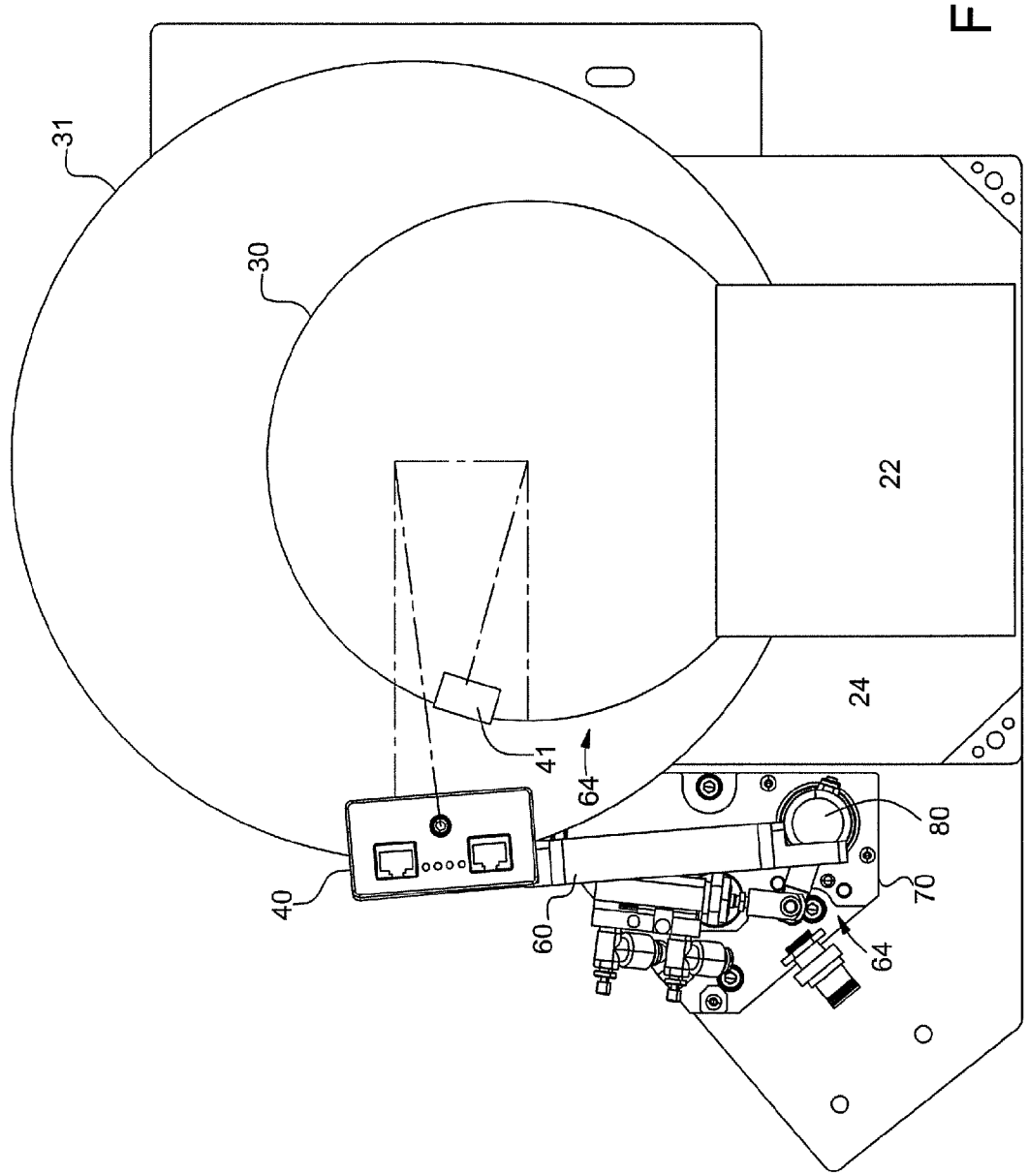
FIG. 3 illustrates a second location out of two possible location of the first optical head that correspond to two different semiconductor wafers of different sizes, according to an embodiment of the invention.

FIG. 3 illustrates first optical head 40 as being at a second position that allows first optical head 40 to read text imprinted on semiconductor wafer 31. FIG. 3 also illustrates field of view 41 of first optical head 40. When positioned at the first position (as illustrated in FIG. 2) first optical head 40 can read text imprinted on semiconductor wafer 30. FIG. 3 does not illustrate second optical head 50 because first optical head 40 is directly above it.

Figure 4:
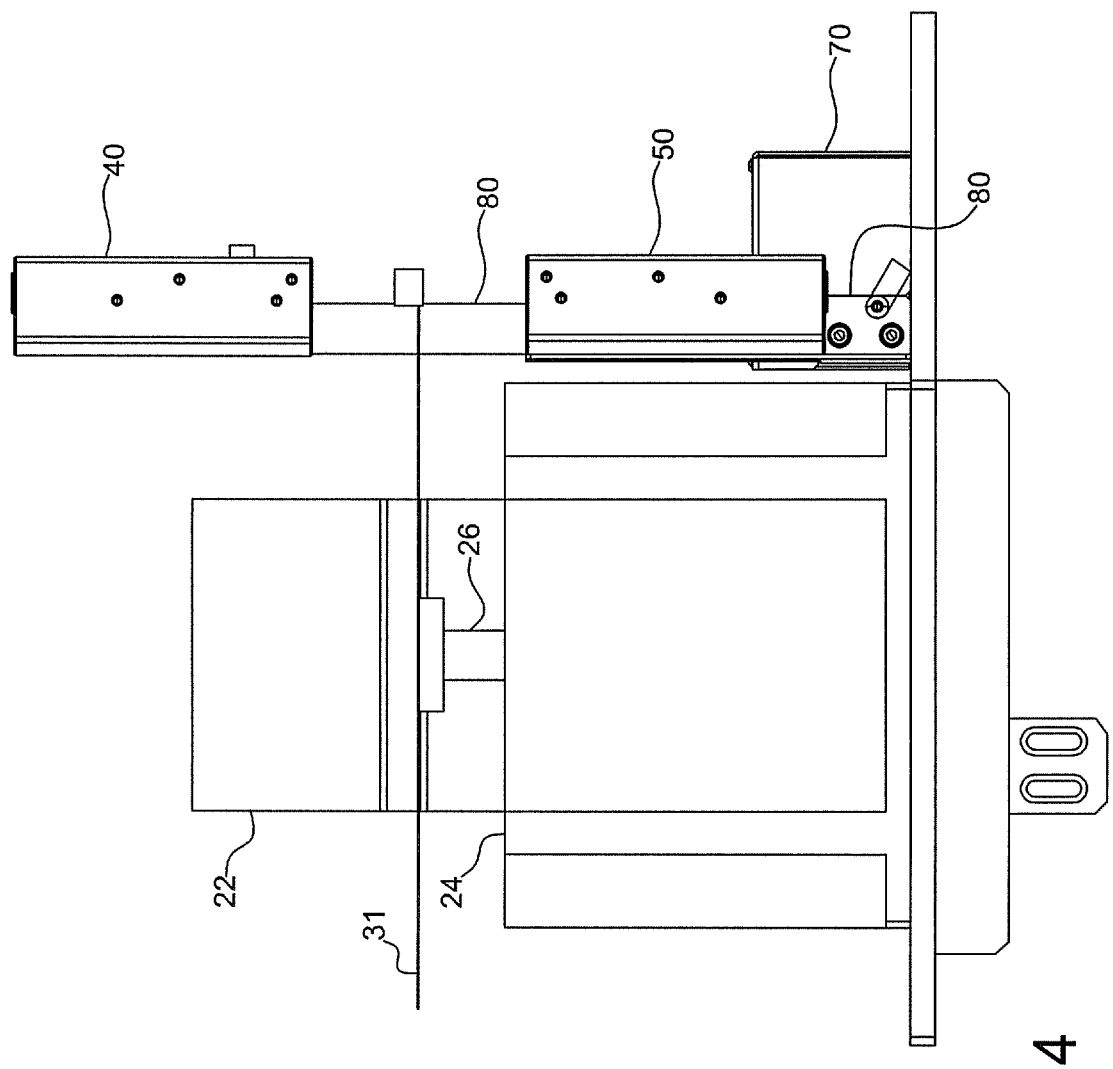
FIG. 4 is a side view of a system that includes two optical heads, according to an embodiment of the invention.
Figure 5:
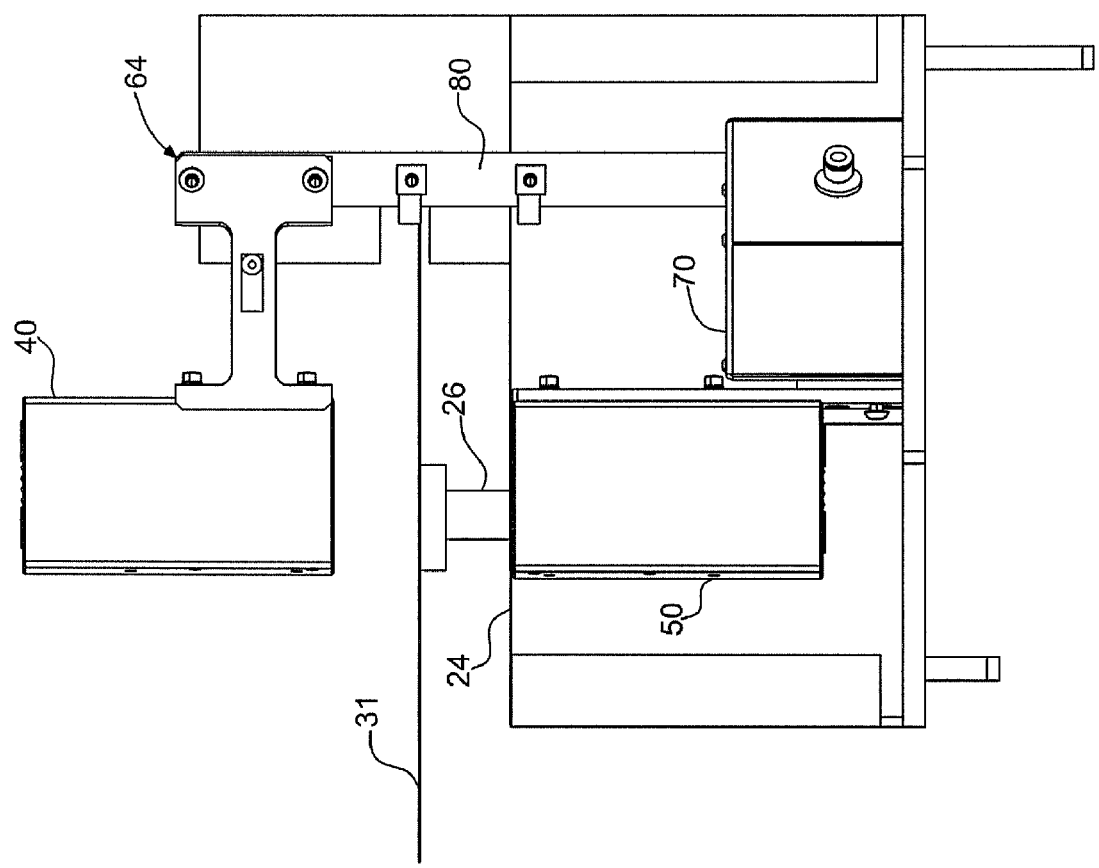
FIG. 5 is a side view of a system that includes two optical heads, according to an embodiment of the invention.

FIG. 4 is a front view of first optical head 40, second optical head 50, semiconductor wafer 31, pole 80, base 70, pre-aligner base 24, rotating stage 26 and pre-aligner optical head 22 according to an embodiment of the invention. FIG. 5 is a side view of first optical head 40, second optical head 50, semiconductor wafer 31, pole 80, base 70, pre-aligner base 24 and rotating stage 26 according to an embodiment of the invention.

FIGS. 4 and 5 illustrate first optical head 40 as being positioned at a second position that allows first optical head 40 to read text imprinted on semiconductor wafer 31. While first optical head 40 reads text imprinted on the upper side of semiconductor wafer 31, second optical head 40 reads text imprinted on the lower side of semiconductor wafer 31.

Second optical head 50 of FIGS. 2, 4 and 5 is connected in a fixed configuration—it illuminates the same area regardless of the size of the semiconductor wafer. Those of skill in the art will appreciate that is can be moved in relation to a semiconductor wafer. First and second optical heads 40 and 50 can be moved by the same supporting element or by different supporting elements. Different supporting elements can be moved in synchronicity with each other but this is not necessarily so.

Figure 6:
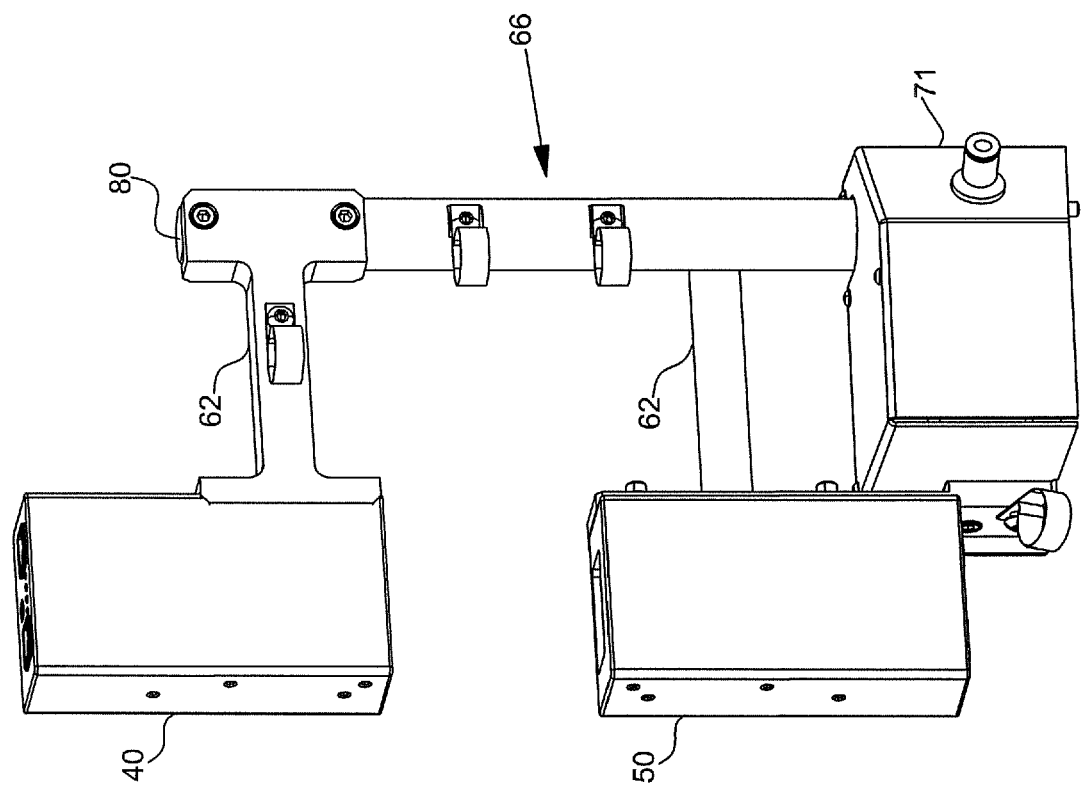
FIG. 6 illustrates two optical heads and a supporting element according to an embodiment of the invention.

FIG. 6 illustrates first and second optical heads 40 and 50 as being connected to pole 80, according to an embodiment of the invention. In this configuration both optical heads are connected to the same supporting element 66. Supporting element 66 includes arms 60 and 62 as well as pole 80.

Figure 7:
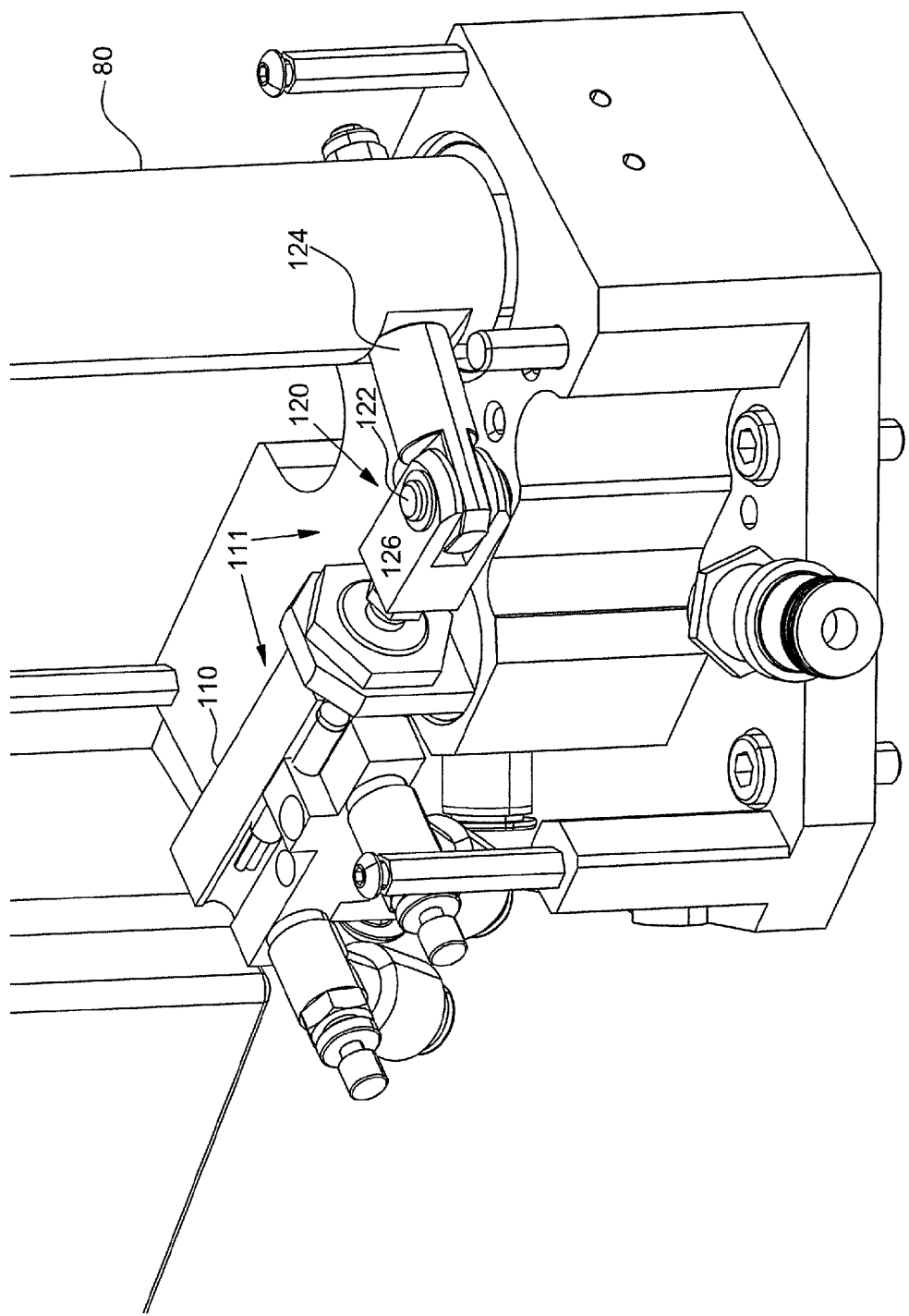
FIG. 7 illustrates a supporting pole that rotates about its axis and a piston that rotates the pole, according to an embodiment of the invention.

FIG. 7 illustrates a lower portion of pole 80, piston 110 and a linear to rotational movement converter 120 according to an embodiment of the invention. Piston 110 and linear to rotational movement converter 120 form first supporting element rotation module 111.

A liner movement of piston 110 is converted to a rotational movement of pole 80 by linear to rotational movement converter 120. Linear to rotational movement converter 120 includes joint 122 and two structural elements 126 and 124. Structural element 126 is connected to piston 110 while structural element 124 is connected to pole 80. Joint 122 is surrounded by holes defined in structural elements 126 and 124. Structural element 124 is connected to pole 80 in a radial manner so that back and forth movements of piston 110 cause pole 80 to rotate about its axis.

Figure 8B:
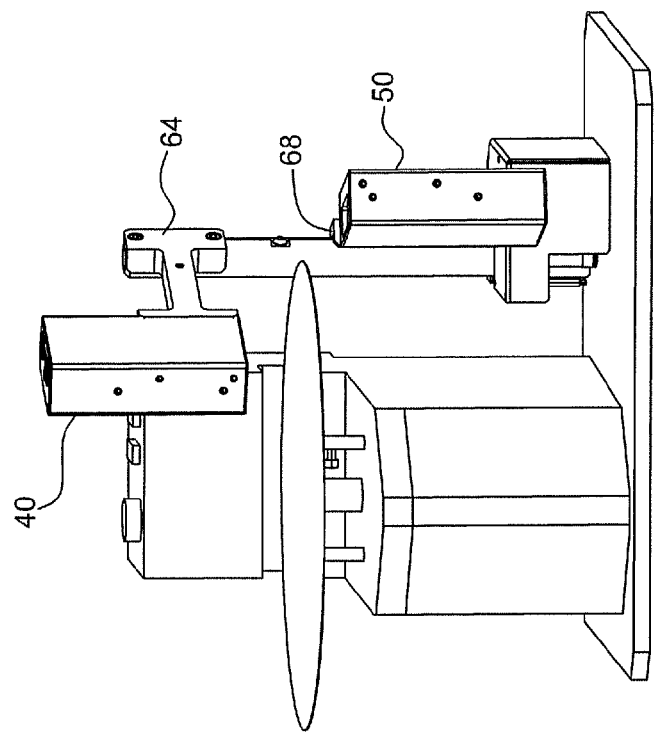
FIGS. 8A and 8B illustrate a pair of optical heads and a pair of supporting elements according to an embodiment of the invention.
Figure 8A:
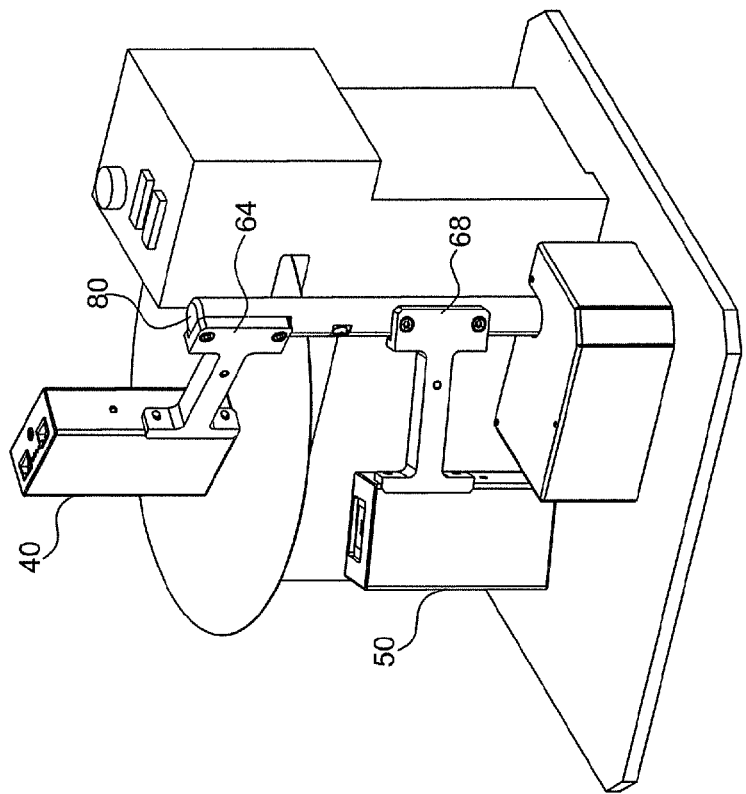

FIGS. 8A and 8B illustrate first and second optical heads 40 and 50 that are connected to two supporting elements 64 and 68 according to an embodiment of the invention. Supporting element 68 can be rotated independently from supporting element 64. Both supporting elements are illustrated as being connected to the same pole 80. While one supporting element out of 64 and 68 rotates with pole 60 the other supporting element can be rotated in relation to pole 60. It is noted that each supporting element out of supporting elements 64 and 68 can have its own pole.

Figure 9:
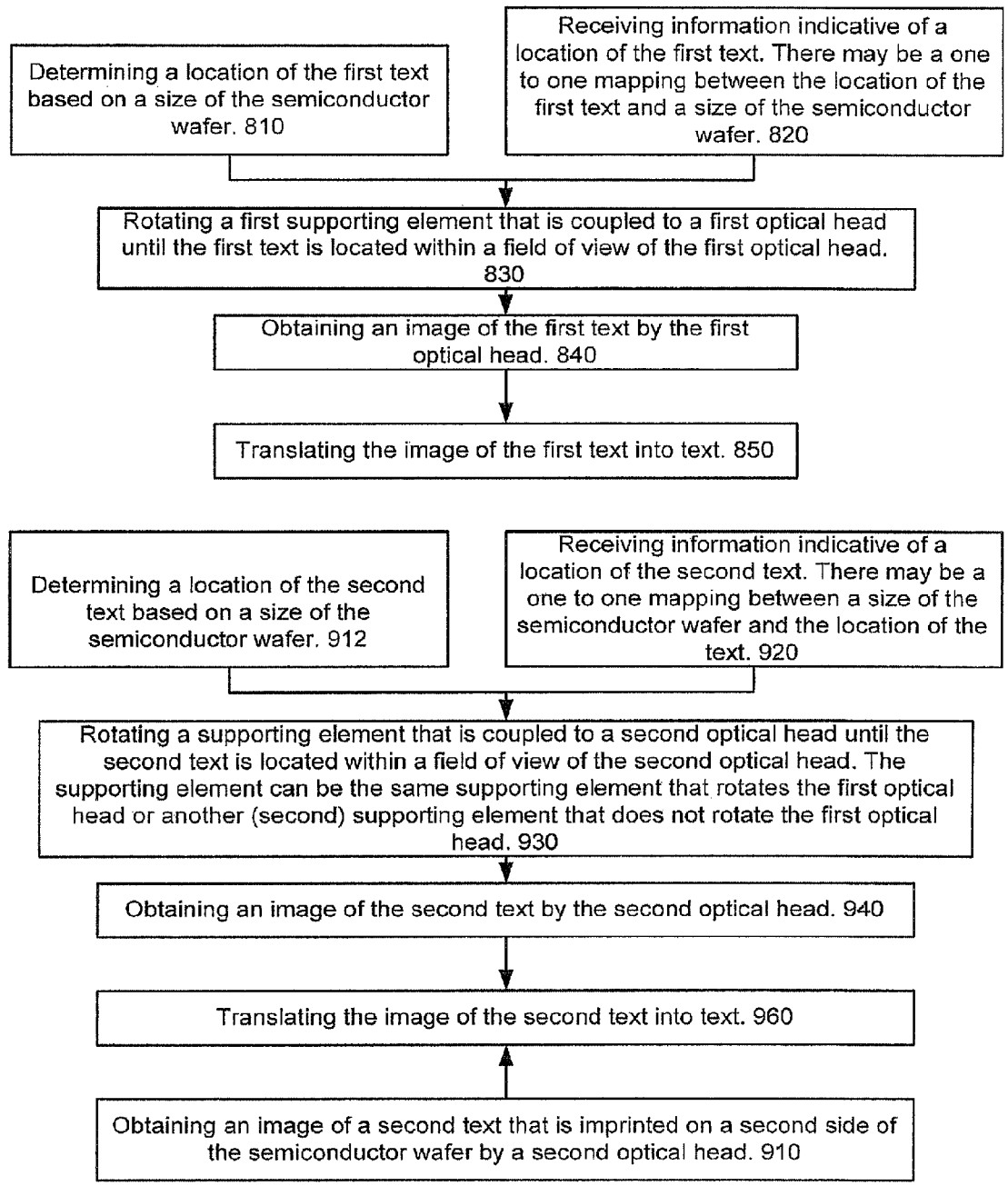
FIG. 9 is a flow chart of a method, according to an embodiment of the invention.

FIG. 9 illustrates method 800 for obtaining a text imprinted on a first side of a semiconductor wafer, according to an embodiment of the invention. While in some embodiments, methods according to the present invention may use the systems and devices as depicted herein, other embodiments may not use the specific equipment described herein.

Method 800 can start by stage 810 or 820.

Stage 810 includes determining a location of the text based on a size of the semiconductor wafer. Accordingly, there may be a one to one mapping between a size of a semiconductor wafer and the location of the text—once the size is known the location of the text is determined based on that size.

Stage 820 includes receiving information indicative of a location of the text.

Stages 810 and 820 are followed by stage 830 of rotating a first supporting element that is coupled to a first optical head until the text is located within a field of view of the first optical head.

Stage 830 may include placing the first optical head at a certain position by rotating the first supporting element; wherein the certain position is selected from multiple possible positions that correspond to semiconductor wafers of different sizes. For example, and referring to the example set forth in FIGS. 2 and 3, one position of first optical head 40 corresponds to semiconductor wafer 30 and another position corresponds to semiconductor wafer 31.

Stage 830 may include moving the optical head between multiple positions wherein at least two of the fields of view that correspond to different positions do not overlap. For example—and referring to the example set forth in FIGS. 2 and 3, fields of view 41 and 42 do not overlap.

Stage 830 may include rotating a pole of the first supporting element about it axis. Wherein the rotating of the pole causes the first optical head (which is connected to the pole via an arm) to rotate.

Stage 830 is followed by stage 840 of obtaining an image of the text by the first optical head.

Stage 840 is followed by stage 850 of translating the image of the text. Stage 850 can be executed by the first optical head. Stage 850 may involve performing OCR. The translating may include taking an image of text and turning it into a machine readable (for example—standardized representation of characters such as but not limited to ASCII) representation of the text.

According to various embodiments of the invention method 800 can allow reading texts that are imprinted on both sides of the semiconductor wafer.

Stage 910 and 920 illustrate the reading of second text by a second optical head that is fixed and does not move between multiple possible positions. Stage 910 includes obtaining an image of a second text that is imprinted on a second side of the semiconductor wafer by a second optical head. Stage 910 is followed by stage 960 of translating the image of the second text into text. Stage 910 may involve performing optical character recognition (OCR). The sequence of stage 910 and 960 can be executed when the second optical head is in a fixed configuration. For example, second optical head 50 may read second text imprinted on the second side of semiconductor wafer 31 while semiconductor wafer 30 does not include text imprinted on its other side.

Stages 912, 920, 930, 940 and 960 illustrate a reading of a second text by a second optical head that is movable between multiple possible positions.

Stage 912 includes determining a location of the second text based on a size of the semiconductor wafer.

Stage 920 includes receiving information indicative of a location of the second text.

Stages 920 and 912 are followed by stage 930 of rotating a supporting element that is coupled to a second optical head until the second text is located within a field of view of the second optical head. The supporting element can be the same supporting element that rotates the first optical head or another (second) supporting element that does not rotate the first optical head.

Stage 930 is followed by stage 940 of obtaining an image of the second text by the second optical head.

Stage 940 is followed by stage 960.

Stage 930 can include simultaneously rotating the first supporting element and the second supporting element. Alternatively, stage 930 can include rotating the first and second supporting elements in a non-overlapping manner.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved.

Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

I claim:

1. A method for obtaining a text imprinted on a first side of a semiconductor wafer, the method comprising:
    determining, by a controller, a location of the text based on a size of the semiconductor wafer;
    rotating a first supporting element that is coupled to a first optical head until the text is located within a field of view of the first optical head;
    obtaining an image of the text by the first optical head; and
    translating the image of the text into text.

2. The method according to claim 1 comprising translating the image of the text by the first optical head.

3. The method according to claim 1 comprising placing the first optical head at a certain position by rotating the first supporting element; wherein the certain position is selected from multiple possible positions that correspond to semiconductor wafers of different sizes.

4. The method according to claim 1 wherein the fields of view of the first optical head that correspond to at least two possible positions do not overlap.

5. The method according to claim 1 wherein the first supporting element comprises a pole and an arm that is coupled to the first optical head; wherein the pole is rotatable along its axis and the arm extends from the pole in a radial manner.

6. The method according to claim 1 comprising obtaining an image of a second text that is imprinted on a second side of the semiconductor wafer by a second optical head; and translating the image of the second text into text; wherein the first side is a upper side of the semiconductor wafer and the second side is a lower side of the semiconductor wafer.

7. The method according to claim 6 comprising:
    determining, by the controller, a location of the second text based on the size of the semiconductor wafer;
    rotating a second supporting element that is coupled to the second optical head until the second text is located within a field of view of the second optical head;
    obtaining an image of the second text by the second optical head; and
    translating the image of the second text into text.

8. The method according to claim 7 comprising simultaneously rotating the first supporting element and the second supporting element.

9. The method according to claim 6 comprising:
    determining a location of the second text based on the size of the semiconductor wafer;
    rotating the first supporting element until the second text is located within a field of view of the second optical head, wherein the first rotating element is coupled to the second optical head;
    obtaining an image of the second text by the second optical head; and
    translating the image of the second text into text.

10. A method for obtaining a text imprinted on a first side of a semiconductor wafer, the method comprising:

receiving, by a controller, information indicative of a location of the text;

rotating a supporting element that is coupled to a first optical head until the text is located within a field of view of the first optical head; wherein the rotating is controlled by the controller;

obtaining an image of the text by the first optical head; and translating the image of the text into text.

11. The method according to claim 10 comprising obtaining an image of a second text that is imprinted on a second side of the semiconductor wafer by a second optical head; and translating the image of the second text into text; wherein the first side is a upper side of the semiconductor wafer and the second side is a lower side of the semiconductor wafer.

12. The method according to claim 11 wherein the method comprises:

determining, by the controller, a location of the second text based on the size of the semiconductor wafer;

rotating a second supporting element that is coupled to the second optical head until the second text is located within a field of view of the second optical head;

obtaining an image of the text by the second optical head; and translating the image of the text into text.

13. The method according to claim 11 comprising:

determining a location of the second text based on the size of the semiconductor wafer;

rotating the first supporting element until the second text is located within a field of view of the second optical head, wherein the first rotating element is coupled to the second optical head;

obtaining an image of the second text by the second optical head; and translating the image of the second text into text.

14. A system, comprising:

a first supporting element for supporting a semiconductor wafer, a first supporting element rotation module, a controller and a first optical head for imaging the semiconductor wafer;

wherein the controller is configured to control a rotation of the first supporting element by the first supporting element rotation module; wherein the rotation is responsive to a size of the semiconductor wafer;

wherein the first supporting element is coupled to the first optical head;

wherein the first supporting element rotation module is configured to rotate the first supporting element until text that is imprinted on a first side of a semiconductor wafer is located within a field of view of the first optical head.

15. The system according to claim 14 wherein the controller is configured to receive information indicative of a size of the semiconductor wafer and determine a certain location of the optical head out of multiple locations associated with semiconductor wafers of different sizes, wherein when the first optical head is positioned at the certain location the text is located within a field of view of the first optical head.

16. The system according to claim 14 wherein fields of view of the first optical head that correspond to at least two possible positions do not overlap.

17. The system according to claim 14 wherein the first supporting element rotation module is configured to rotate a pole of the first supporting element about its axis; wherein the pole is coupled to an arm that is coupled to the first optical head; wherein the arm extends from the pole in a radial manner.

18. The system according to claim 14 comprising a second optical head that is configured to obtain an image of a second text that is imprinted on a second side of the semiconductor wafer; wherein the system is further configured to translate the image of the second text into text; wherein the first side is a upper side of the semiconductor wafer and the second side is a lower side of the semiconductor wafer.

19. The system according to claim 16 wherein the controller is configured to control a rotation of a second supporting element by a second supporting element rotation module; wherein the rotation is responsive to a size of the semiconductor wafer; wherein the second supporting element is coupled to the second optical head; wherein the second supporting element rotation module is configured to rotate the second supporting element until the second text is located within a field of view of the second optical head.

20. The system according to claim 19 wherein the first supporting element and the second supporting element are rotated in parallel to each other.

21. The system according to claim 12 comprising a semiconductor wafer pre-aligner.

* * * * *